United States Patent
Varadarajan et al.

(10) Patent No.: US 10,637,402 B2
(45) Date of Patent: Apr. 28, 2020

(54) CHARGE PUMP FOR SCALING THE HIGHEST OF MULTIPLE VOLTAGES WHEN AT LEAST ONE OF THE MULTIPLE VOLTAGES VARIES

(71) Applicant: Aura Semiconductor Pvt. Ltd, Bangalore (IN)

(72) Inventors: Sudarshan Varadarajan, Bangalore (IN); Arnold J D'Souza, Bangalore (IN); Shyam Somayajula, Bangalore (IN)

(73) Assignee: Aura Semicoductor Pvt. Ltd, Bangalore (IN)

( * ) Notice: Subject to any disclaimer, the term of this patent is extended or adjusted under 35 U.S.C. 154(b) by 0 days.

(21) Appl. No.: 16/102,741

(22) Filed: Aug. 14, 2018

(65) Prior Publication Data

US 2019/0319586 A1    Oct. 17, 2019

Related U.S. Application Data

(60) Provisional application No. 62/658,626, filed on Apr. 17, 2018.

(30) Foreign Application Priority Data

Jun. 26, 2018   (IN) .............................. 201841023793

(51) Int. Cl.
*H03F 1/02*      (2006.01)
*H02M 3/07*      (2006.01)
*H03F 3/187*     (2006.01)

(52) U.S. Cl.
CPC .......... *H03F 1/0227* (2013.01); *H02M 3/073* (2013.01); *H03F 3/187* (2013.01); *H03F 2200/03* (2013.01)

(58) Field of Classification Search
CPC . H03F 1/00; H03F 1/02; H03F 1/0205; H03F 1/0211; H03F 1/0216;
(Continued)

(56) References Cited

U.S. PATENT DOCUMENTS

| | | |
|---|---|---|
| 6,091,617 A | 7/2000 | Moran |
| 6,377,106 B1 | 4/2002 | Rozsypal |

(Continued)

FOREIGN PATENT DOCUMENTS

WO    2013075304 A1    8/2018

OTHER PUBLICATIONS

Janusz A. Starzyk and Ying-Wei Jan, A DC-DC Charge Pump Based on Voltage Doublers, http://www.ohio.edu/people/starzykj/network/research/Simulation/Papers/chargePump.PDF, date Mar. 2001, pp. 1-24.

*Primary Examiner* — Lincoln D Donovan
*Assistant Examiner* — Diana J. Cheng
(74) *Attorney, Agent, or Firm* — IPHORIZONS PLLC; Narendra Reddy Thappeta

(57) ABSTRACT

A charge pump includes a scaler circuit and a selector circuit. The scaler circuit is designed to scale an intermediate voltage by a scaling factor to generate a scaled voltage. The selector circuit is designed to select and provide the intermediate voltage from multiple voltages. The selector circuit includes a comparator block to generate a select signal indicating which of the multiple voltages has the highest magnitude. The selector circuit includes multiple switches, each switch to receive a respective voltage from among the multiple voltages and pass the corresponding voltage as the intermediate voltage if the select signal indicates that the voltage received by the corresponding switch has the highest magnitude.

19 Claims, 7 Drawing Sheets

(58) Field of Classification Search
CPC ...... H03F 1/0222; H03F 1/0227; H03F 3/181; H03F 3/183; H03F 3/187; H03F 2200/03; H02M 3/00; H02M 3/02; H02M 3/04; H02M 3/06; H02M 3/07; H02M 3/073; H02M 2003/075; H02M 2003/076; H02M 2003/077; H02M 2003/078
See application file for complete search history.

(56) References Cited

U.S. PATENT DOCUMENTS

| | | |
|---|---|---|
| 7,145,382 B2 | 12/2006 | Ker et al. |
| 7,215,043 B2 | 5/2007 | Tsai et al. |
| 7,579,902 B2 | 8/2009 | Frulio et al. |
| 7,741,898 B2 | 6/2010 | Hsu |
| 8,022,574 B2 | 9/2011 | Ryoo |
| 8,319,375 B2 * | 11/2012 | Taniuchi ............... H02J 1/102 307/29 |
| 8,373,396 B2 | 2/2013 | Huang et al. |
| 8,674,749 B2 | 3/2014 | Tran et al. |
| 9,201,436 B2 | 12/2015 | Petrovic et al. |
| 9,306,450 B2 * | 4/2016 | Emira ................... H02M 3/07 |
| 9,438,103 B2 | 9/2016 | Siao |
| 2004/0217653 A1 | 11/2004 | Neidorff |
| 2014/0132327 A1 | 5/2014 | Liao |
| 2016/0072379 A1 | 3/2016 | Hirano et al. |
| 2018/0278213 A1 * | 9/2018 | Henzler ............... H03F 1/0227 |

* cited by examiner

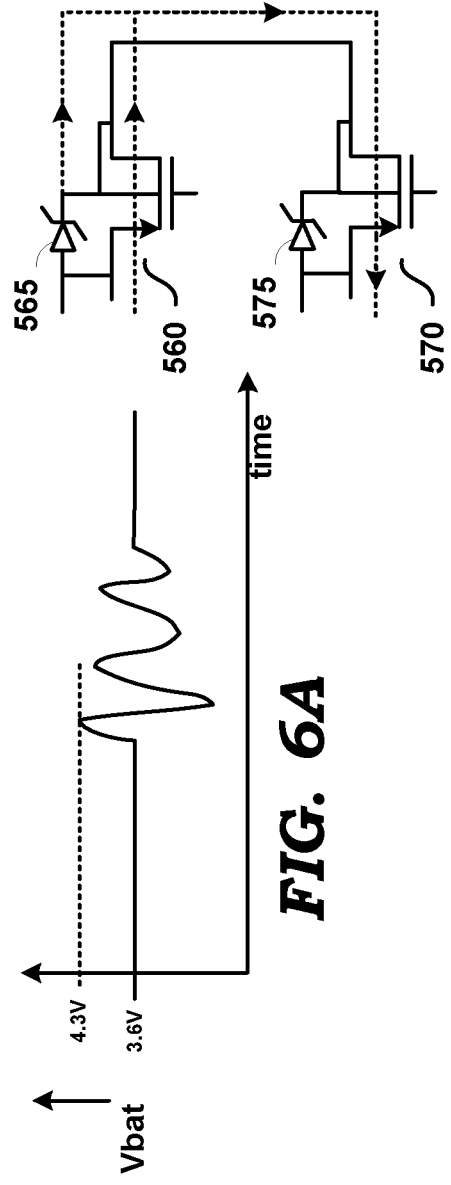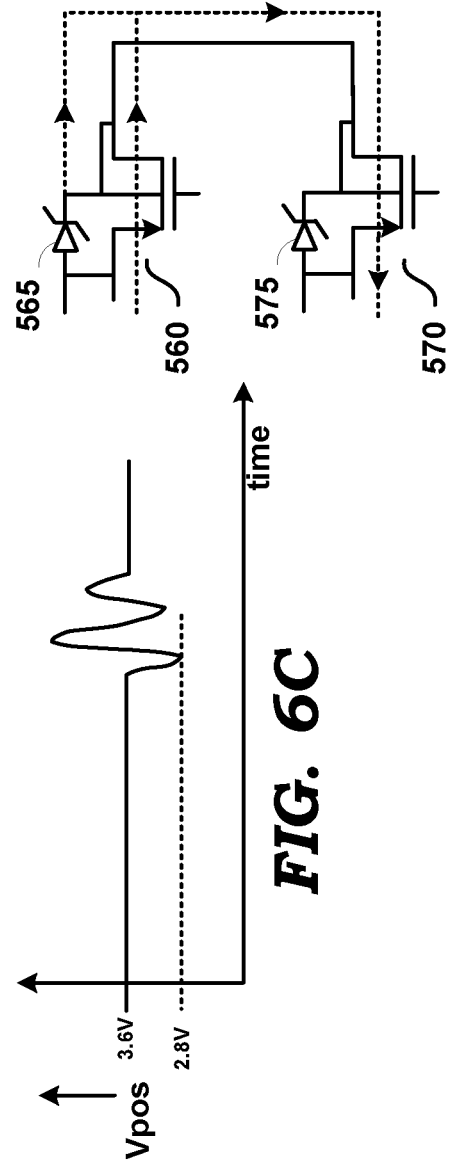

CHARGE PUMP FOR SCALING THE HIGHEST OF MULTIPLE VOLTAGES WHEN AT LEAST ONE OF THE MULTIPLE VOLTAGES VARIES

PRIORITY CLAIM

This application claims priority to and the benefit of U.S. Provisional Patent Application No. 62/658,626, filed Apr. 17, 2018 and titled "CHARGE PUMP FOR SCALING THE HIGHEST OF MULTIPLE VOLTAGES WHEN AT LEAST ONE OF THE MULTIPLE VOLTAGES VARIES," which is incorporated herein by reference in its entirety.

The instant patent application is related to and claims priority from the co-pending India patent application entitled, "CHARGE PUMP FOR SCALING THE HIGHEST OF MULTIPLE VOLTAGES WHEN AT LEAST ONE OF THE MULTIPLE VOLTAGES VARIES", Serial No.: 201841023793, Filed: Jun. 26, 2018, which is incorporated in its entirety herewith to the extent not inconsistent with the disclosure herein.

BACKGROUND

Technical Field

Embodiments of the present disclosure relate generally to charge pumps, and more specifically to a charge pump for scaling the highest of multiple voltages when at least one of the multiple voltages varies.

Related Art

A charge pump refers to a circuit which scales or magnifies an input voltage. Voltage doublers, voltage triplers, etc., are well known examples of charge pumps. Charge pumps find use in various electronic circuits such as DC-to-DC converters, power amplifiers, etc., as is well known in the relevant arts.

Charge pumps are often required to scale one of multiple input voltage signals. One or more of such voltage signals can vary, i.e., change in magnitude over time. Such a varying signal can change in an analog fashion or discrete fashion. As is well known in the relevant arts, changes in analog fashion implies the signal changes continuously over time, while discrete fashion implies changes at discrete time points and/or with discrete amplitude levels.

As may be readily appreciated, due to the variation in voltage levels, any of the input signals can potentially have greater magnitude at respective time instances. The word highest here implies greater magnitude, disregarding the polarity of the input voltages. Aspects of the present disclosure are directed to scaling the highest of such multiple input voltage signals in a charge pump.

BRIEF DESCRIPTION OF THE VIEWS OF DRAWINGS

Example embodiments of the present disclosure will be described with reference to the accompanying drawings briefly described below.

FIGS. 6A and 6B are diagrams used to illustrate an example in which a pair of power supply terminals in a selector of a charge pump can get shorted.

FIGS. 6C and 6D are diagrams used to illustrate another example in which a pair of power supply terminals in a selector of a charge pump can get shorted.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A charge pump provided according to an aspect of the present disclosure includes a scaler circuit and a selector circuit. The scaler circuit is designed to scale an intermediate voltage by a scaling factor to generate a scaled voltage. The selector circuit is designed to select and provide the intermediate voltage from multiple voltages. The selector circuit may include a comparator block to generate a select signal indicating which of the multiple voltages has the highest magnitude. The selector circuit includes multiple switches, each switch to receive a respective voltage from among the multiple voltages and pass the corresponding voltage as the intermediate voltage if the select signal indicates that the voltage received by the corresponding switch has the highest magnitude.

In an embodiment, the charge pump is implemented in a class-L amplifier, which in turn contains a DC-DC converter and a power amplifier. The scaled voltage generated by the charge pump is used to operate (e.g., switch ON) one or more switches in either one or both of the DC-DC converter and the power amplifier. The one or more switches are configured to pass corresponding voltages, and require the scaled voltage to be greater than any of the corresponding voltages for operation.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Charge Pump

Figure 1:
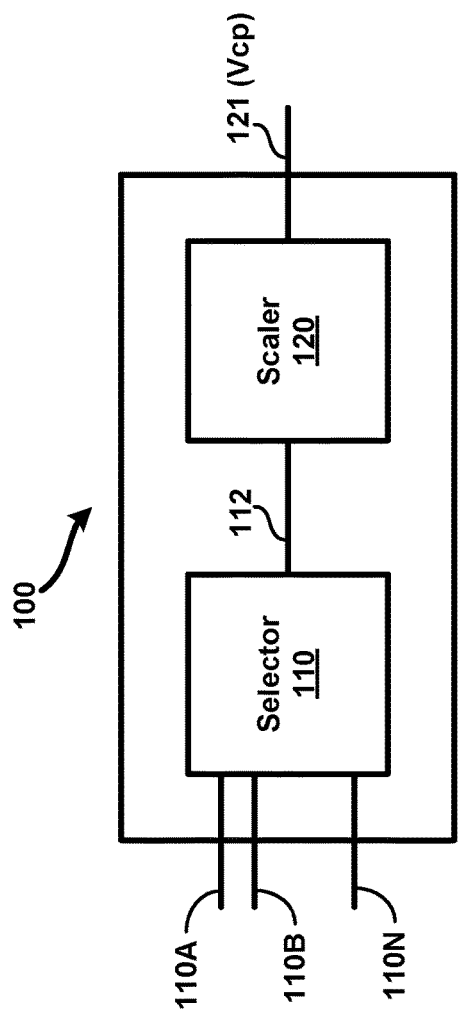
FIG. 1 is a block diagram of a charge pump in which several aspects of the present disclosure can be implemented.

FIG. 1 is a block diagram of a charge pump in which several aspects of the present disclosure can be implemented. FIG. 1 is shown containing charge pump 100, which in turn is shown containing a selector circuit (selector 110) and a scaler circuit (scaler 120). Selector 110 receives voltage inputs 110A through 110N, each of which may be generated, for example by a power supply such as a battery or a DC-DC converter.

Selector 110 is designed to select the highest of the voltages 110A-110N, and provide the selected highest voltage on path 112 (intermediate voltage). Scaler 112 is designed to scale the intermediate voltage 112 by a suitable (or desired) factor, and provide the scaled voltage as output 121 (Vcp) of charge pump 100. Scaling by a suitable factor may refer to multiplication of intermediate voltage by a factor (fixed or variable), or addition of a fixed voltage to the magnitude of the intermediate voltage 112.

As noted above, charge pumps find use in electronics circuits. Specifically, a charge pump, such as a charge pump 100, may find use in environments in which a highest of several voltages (one or more of which may be varying as noted above) needs to be selected and scaled to provide a final output voltage. An example environment is one in which a driver of a switch used to pass a specific voltage range needs to be powered by a supply voltage that needs to be always greater, by a desired magnitude, than the specific voltage passed by the switch, as illustrated next with example circuits.

3. Example Environment

Figure 2:
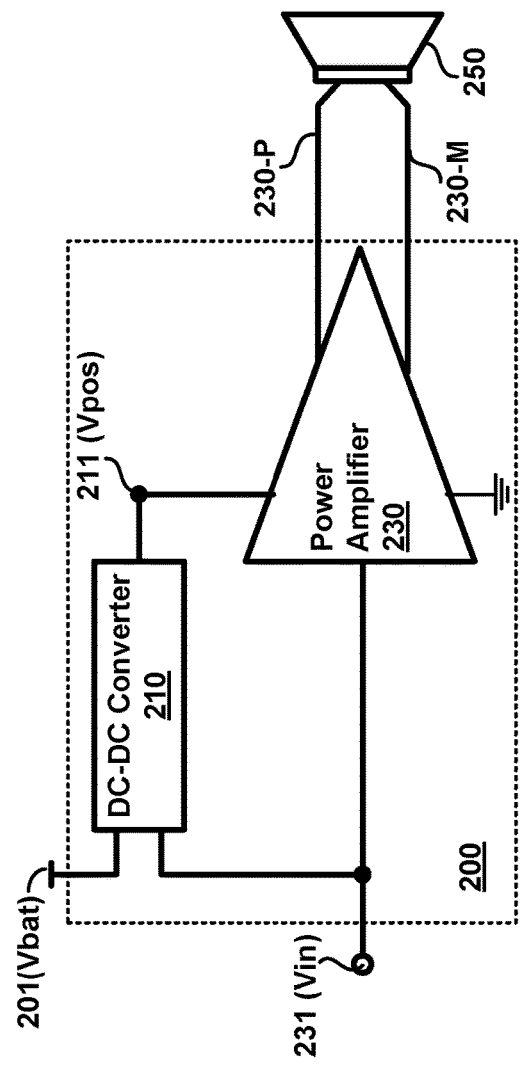
FIG. 2 is a block diagram of a power amplifier driving a speaker, in which the power amplifier is powered by a DC-DC converter.

FIG. 2 is a block diagram of component in which a charge pump (100) implemented according to several aspects of the present disclosure can be used. FIG. 2 is shown containing DC-DC converter 210, linear power amplifier 230 and speaker 250. DC-DC converter 210 and power amplifier 230 together form class-L amplifier 200. The implementation and operational details of class-L amplifier 200 are described in detail in U.S. Pat. No. 9,319,495, entitled 'Power Amplifier Providing High Efficiency', which is incorporated in its entirety herewith. Power amplifier 230 (e.g., class AB amplifier), receives a signal 231 (e.g., an audio signal having frequency content lying in the frequency range of approximately 20 Hertz to 20,000 Hertz), and provides a corresponding power-amplified differential output signal across terminals 230-P and 230-M to drive speaker 250, although the power-amplified signal can be single-ended also. DC-DC converter 210 receives power (e.g., from a battery, not shown) via path 201, and generates a regulated voltage on path 211 (Vpos), which provides power for operation of power amplifier 230.

In the specific example of FIG. 2, the magnitude of voltage 211 provided to power the operation of power amplifier 230 is itself modulated to be always only slightly larger than the instantaneous magnitude of the higher of output signals 230-P and 230-M. Therefore, DC-DC converter 210 also receives input signal 231 as a reference signal to generate voltage 211.

Figure 3:
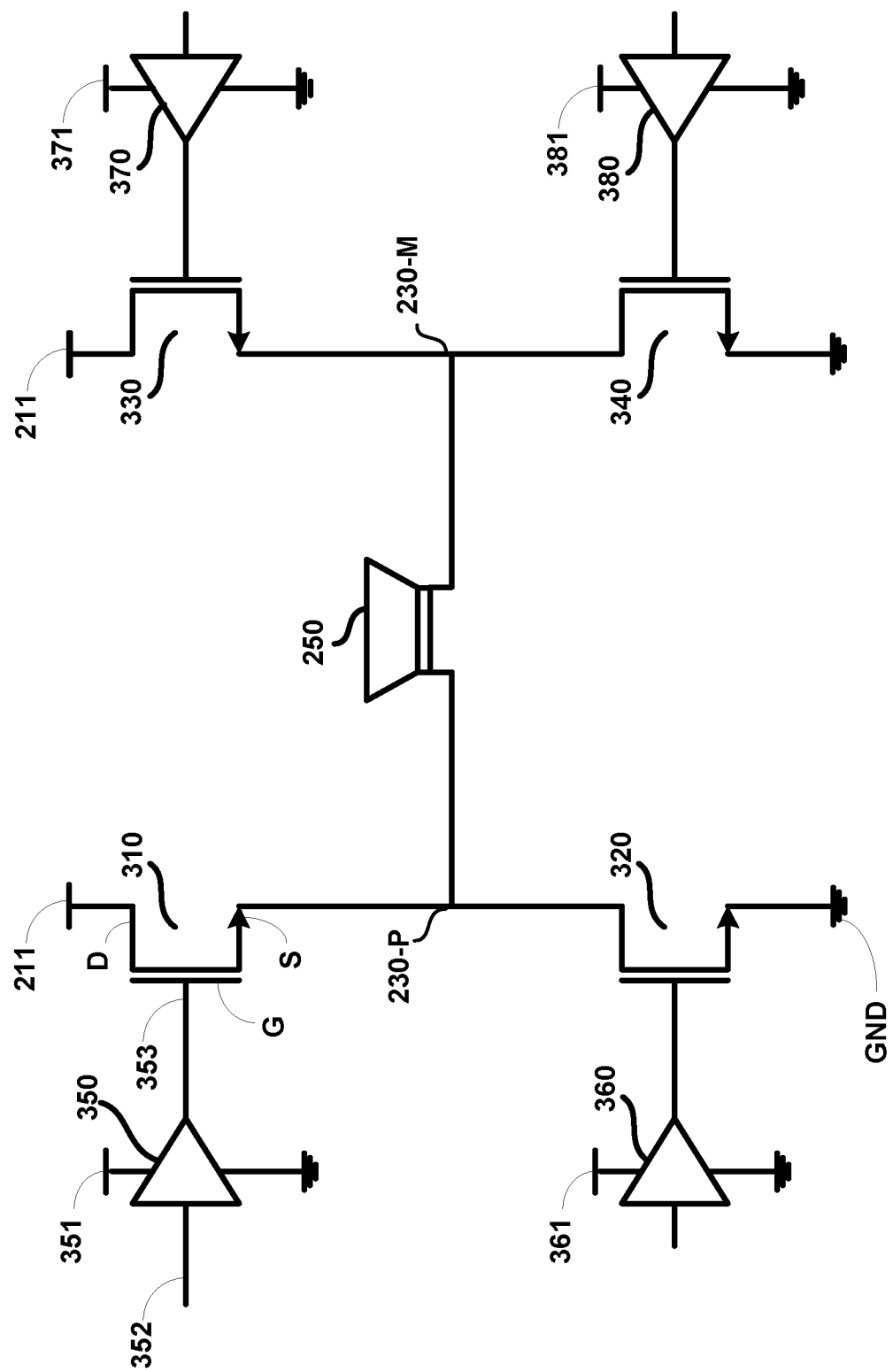
FIG. 3 is a diagram showing the output stage of a power amplifier.

FIG. 3 is a diagram showing the output stage of power amplifier 230. The output stage is shown containing switches 310, 320, 330 and 340. In the example, each of switches 310, 320, 330 and 340 is implemented as an N-type Metal Oxide Semiconductor (NMOS) transistor to reduce implementation area (NMOS transistors have higher conductivity than P-type MOS components of the same size).

The source, gate and drain terminals of NMOS switch 310 are marked in FIG. 3 by the letters S, G and D respectively. The terminals of the other switches are not marked, but can be identified by the drawing convention used for the switches. "GND" represents a ground terminal.

Buffers 350, 360, 370 and 380 respectively drive the gate terminals of NMOS switches 310, 320, 330 and 340. The drain terminals of switches 310 and 330 are each connected to output 211 of DC-DC converter 210. Buffer 350 is shown receiving an input signal 352 and providing a corresponding buffered output 353. Each of buffers 360, 370 and 380 also receives corresponding inputs (not marked) and provides corresponding drive signals (also not shown). Instantaneous magnitudes of the inputs and outputs of the buffers have values that depend on the specific instantaneous value of the input signal 231 that needs to be amplified and provided across 230-P and 230-M.

In an embodiment, the voltage at power supply terminal 211 (Vpos) varies from 50 millivolts to 8.5 volts (to accommodate corresponding range of input signal 231). For switch 310 to be turned ON and pass the voltage 211 onto terminal 230-P, the drive voltage 353 applied to the gate terminal of switch 310 should be greater than voltage 211 by Vt (threshold voltage) of switch 310.

Therefore, the power supply 351 provided for operation of buffer 350 needs to be at least (Vpos+Vgs), wherein Vgs is the gate-to-source voltage of switch 310 when ON, and which must be greater than the threshold voltage Vt for transistor 310. Similarly, the power supply 371 of driver 370 also needs to be at least (Vpos+Vgs), wherein Vgs is also the gate-to-source voltage of switch 330. The supplies 361 and 381 of drivers 360 and 380 are fixed values, which need to be high enough so that buffers 360 and 380 can switch ON NMOS switches 320 and 340.

Since supplies 351 and 371 need to be greater than Vpos, a charge pump is required to generate these supplies (since DC-DC converter 210 generates only Vpos).

Figure 4:
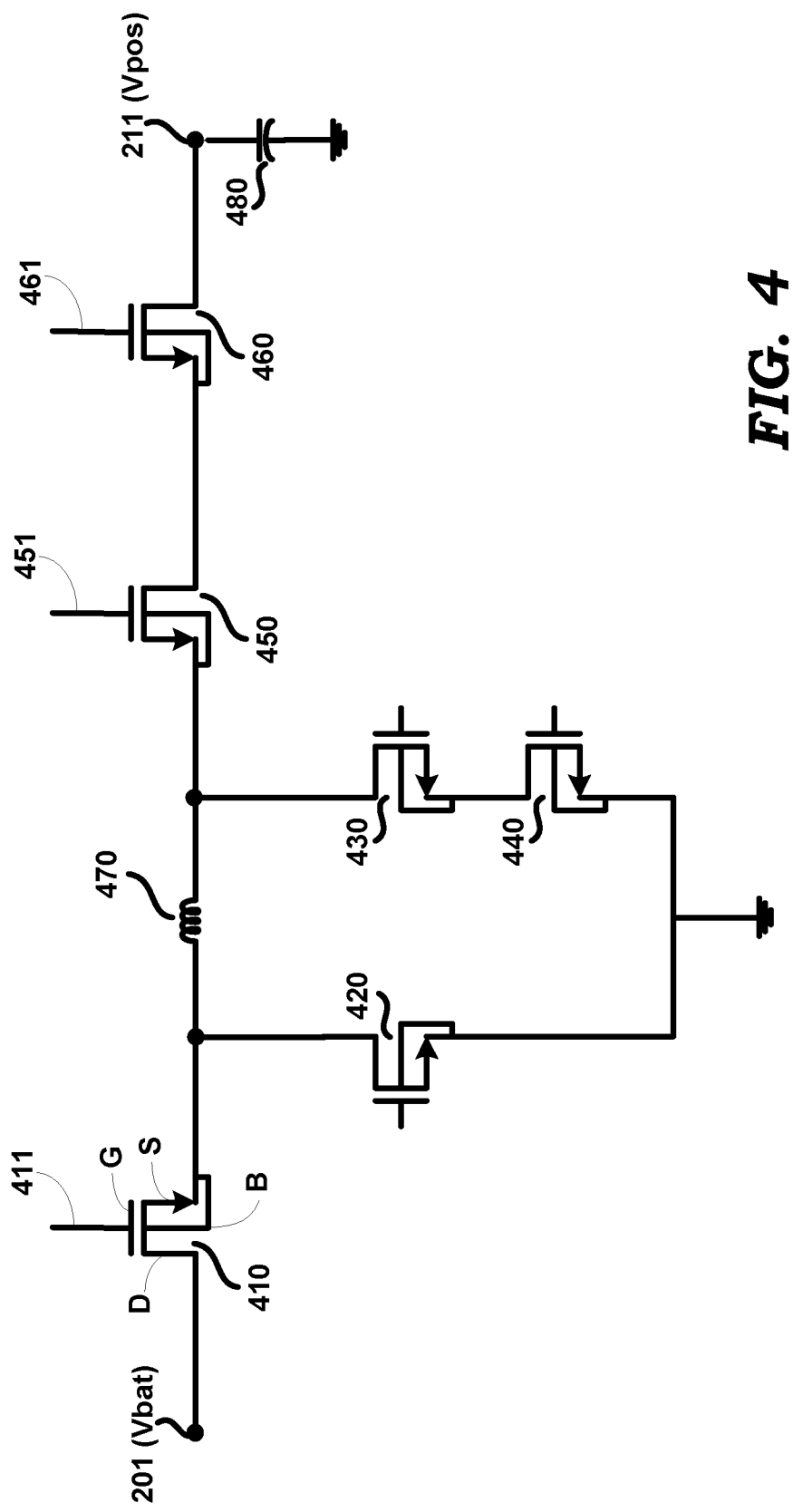
FIG. 4 shows relevant internal details of a DC-DC converter.

FIG. 4 shows relevant internal details of DC-DC converter 210. NMOS switches 410, 420, 430, 440, 450 and 460 are controlled to be ON or OFF in corresponding phases of operation (well known in the relevant arts), to cause current to rise in inductor 470 in one phase, and fall in inductor 470 in another phase. Component 480 represents a capacitor. It may be observed from FIG. 4 that the gate terminals of at least some of the NMOS switches (e.g., 410, 450 and 460) need to be driven to voltages greater than Vbat (201) or Vpos (211) in order to be switched ON. For example, since the drain terminal of switch 410 is connected to Vbat, the voltage (gate voltage) to be applied on its gate terminal 411 required to turn ON switch 410 should be greater than Vbat (in the example circuit of FIG. 4, the gate voltage needs to be (Vbat+5 Volts)). Similarly, since the drain terminal of switch 460 is connected to Vbat, the gate voltage (required to be applied on gate terminal 461) required to turn ON switch 460 should be greater than Vpos (in the example circuit of FIG. 4, the gate voltage needs to be (Vpos+5 Volts)). The gate voltage required to be applied on gate terminal 451 to turn on switch 450 is also Vpos+5 Volts.

Thus, some gate voltages (drive voltages) need to be greater than Vbat, while some other gate voltages need to be greater than Vpos. In the example environment of FIGS. 2, 3 and 4, some drive voltages (e.g., that for switch 410) need to be 2*Vbat (two times Vbat), while some other drive voltages (e.g., that for switch 460) need to be (Vpos+Vbat). For reasons such as reduced complexity, it may be desirable to have a charge pump generate a single voltage that satisfies the above requirement, and which therefore can be supplied as the drive voltage to all the switches noted above. Thus, when Vpos is less than Vbat, the charge pump may need to generate a voltage equal to (2*Vbat), while when Vpos is greater than Vbat, the charge pump may need to generate a voltage equal to (Vpos+Vbat).

From the description above, it may be appreciated that the charge pump first needs to select the higher of Vbat and Vpos, and then scale the selected voltage by adding Vbat, i.e., the voltage generated by the charge pump should be [max (Vbat, Vpos)+Vbat], wherein max (Vbat, Vpos) represents an operation that selects the higher of the two voltages Vbat and Vpos. Thus, the charge pump needs to include a circuit that, in real time (continuously, i.e., in analog fashion), selects the higher of Vbat and Vpos. The charge pump then needs to scale the selected higher voltage by adding a voltage equal to Vbat.

The specific voltages noted above are provided merely by way of illustration. In general, the charge pump needs to be designed to select the highest (instantaneous) voltage from among multiple voltages, and scale the selected voltage, as also described above with respect to charge pump 100 of FIG. 1. The implementation details of charge pump 100 are described next with respect to an example embodiment.

4. Maximum Voltage Selector

As noted above with respect to FIG. 1, (maximum voltage) selector 110 of charge pump 100 may receive multiple voltages as inputs, and provides the highest-valued of the voltages as output 112. An embodiment of selector 110, in which selector 110 receives a pair of voltages as inputs, and selects the higher voltage of the pair as its output, is described next with respect to FIG. 5.

Figure 5:
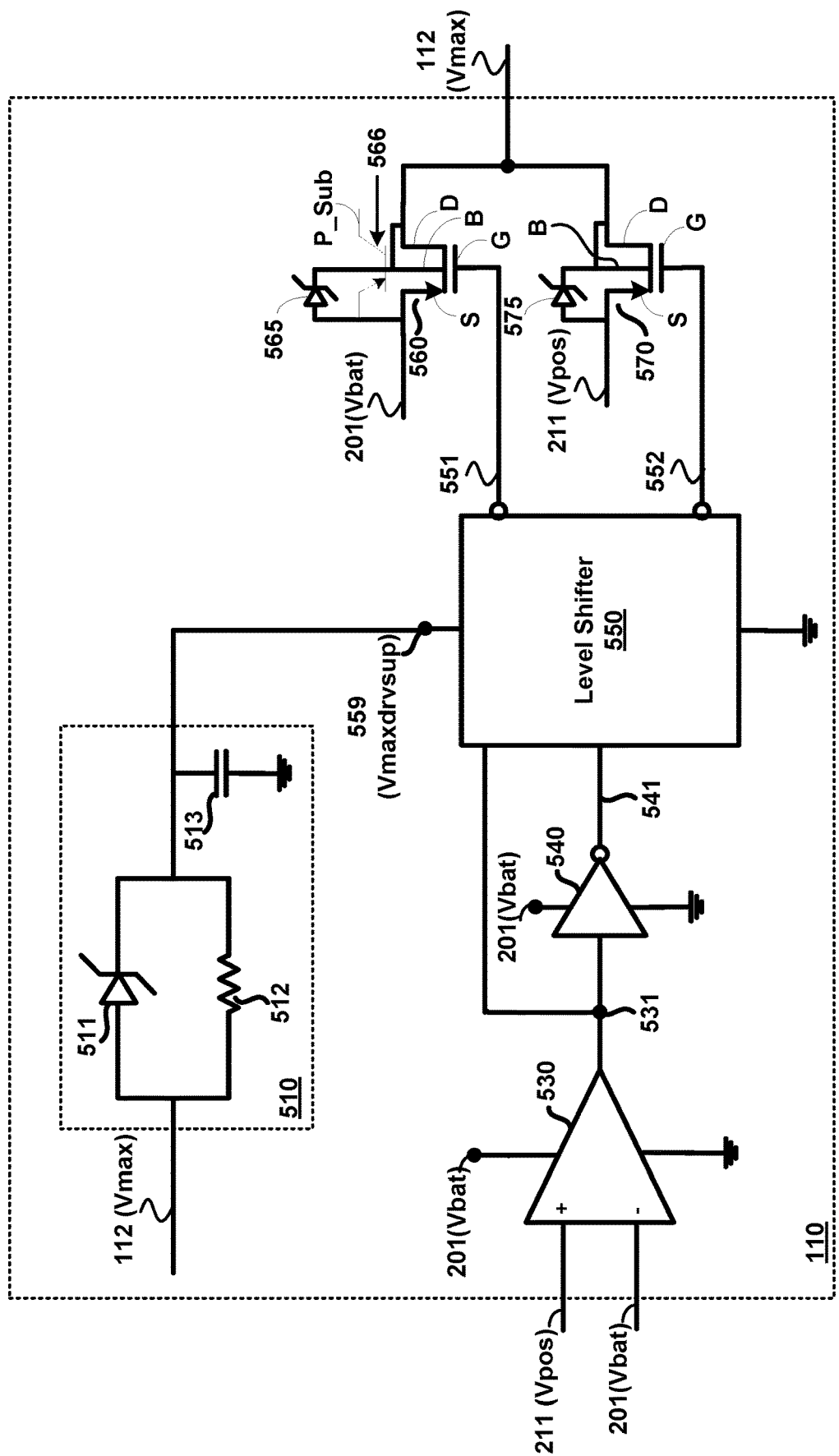
FIG. 5 is a diagram illustrating the implementation details of a maximum voltage selector used in a charge pump, in an embodiment of the present disclosure.

FIG. 5 is a diagram depicting the implementation details of selector 110 in an embodiment of the present disclosure. Selector 110 receives voltages 211 (Vpos) and 201 (Vbat) as inputs. Paths 211 and 201 may correspond to a pair of paths in the set 110A through 110N shown in FIG. 1. Selector 110 provides the higher of the two voltages Vpos and Vbat on path 112 (Vmax). Selector 110 is shown containing comparator 530, inverter 540, level shifter 550, P-type MOS (PMOS) transistors 560 and 570 and Schottky diodes 565 and 575. PMOS transistors 560 and 570 are each operated as switches. The gate, drain, source and bulk terminals of PMOS switches 560 and 570 are respectively marked as G, D, S and B.

Comparator 530 and inverter 540 are powered for operation by Vbat. In an embodiment, Vbat can be any voltage in the range 3 volts to 5.5 volts. Vpos may vary between 50 milli-volts and 8.5 volts. Thus, in the embodiment, Vbat and Vpos are unipolar voltages. In the embodiment, Vpos is designed to vary continuously based on the value of Vin (231) (FIG. 2). However, in other embodiment, Vpos may be designed to vary in a discrete fashion (both in amplitude and in time). Level shifter 550 is powered for operation by a voltage Vmaxdrvsup (559), which is derived from the output 112 (Vmax) after being processed by circuit 510, as described below. It may be appreciated that in embodiments, in which there are more than two inputs voltages to selector 110 (on paths 110A-110N), more than one comparator may be required to determine the highest of such input voltages. Accordingly, in such embodiments, several of comparators such as comparator 530 may be required, and the set of such comparators may be referred to as a 'comparator block'. Similarly, more than two switches would be required to pass the corresponding voltages when there are more than two input voltages to be selected.

Comparator 530 generates a binary signal 531, which indicates which of voltages Vpos and Vbat is higher. For example, binary signal 531 (sel-vpos) is a logic 1 (voltage approximately equal to Vbat) if Vpos is higher than Vbat, and a logic 0 (voltage approximately equal to 0 volts) if Vpos is less than Vbat. Inverter 540 is also powered for operation by Vbat, and provides on path 541 (sel-vbat) the logical inverse of binary signal 531. Both binary signals 531 and 541 are provided as inputs to level shifter 550, and either or both may be viewed as a 'select signal'.

Level shifter 550 performs voltage level shifting for signal sel-vbat to generate an active-low signal sel-vbat-shift (551). Level shifter 550 performs voltage level shifting for signal sel-vpos to generate an active-low signal sel-vpos-shift (552). Signals 551 and 552 are applied to the gate (control) terminals of switches 560 and 570, and may be viewed as control signals. Level shifter 550 may be implemented in a known way.

When Vpos is greater than Vbat, sel-vpos-shift is asserted (active low), while sel-vbat-shift is de-asserted (logic high). As a result, switch 570 is ON and switch 560 is OFF. Vpos applied to the source terminal of switch 570 is passed as Vmax 112. On the other hand, when Vbat is greater than Vpos, sel-vbat-shift is asserted (active low), while sel-vpos-shift is de-asserted (logic high). As a result, switch 560 is ON and switch 570 is OFF. Vbat applied to the source terminal of switch 560 is passed as Vmax 112.

Voltage level shifting by level shifter 550 is required since the highest voltage at drain terminals of switches 560 and 570 can be as high as the maximum value of Vpos (8.5 volts in an embodiment). Signals sel-vbat (541) and sel-vpos (531) can have a maximum voltage of only Vbat since these signals are generated respectively by inverter 540 and comparator 530, each of which is powered by Vbat (which can be as low as 3 volts in an embodiment). Therefore, in an embodiment, level shifter 550 generates the logic high value of each of signals sel-vbat-shift (551) and sel-vpos-shift (552) with a voltage equal to Vmax volts, and a logic low value of each of signals sel-vbat-shift (551) and sel-vpos-shift (552) with a voltage equal to (Vmax−5) volts. Although the logic low values of each of signals sel-vbat-shift (551) and sel-vpos-shift (552) can be theoretically as low as zero, a value of (Vmax−5) volts is used to limit stress imposed by the process used for fabricating charge pump 100.

The bulk terminal of transistor 560 is tied to the drain terminal of transistor 560, since the drain terminal of transistor 560, being connected to Vmax (112), can be at the highest potential compared to the source and gate terminals of transistor 560. Similarly, the bulk terminal of transistor 570 is tied to the drain terminal of transistor 570, since the drain terminal of transistor 570, being connected to Vmax (112), can be at the highest potential compared to the source and gate terminals of transistor 570. As is well known in the relevant arts, for a PMOS transistor (such as transistors 560 and 570), the bulk terminal must always be at the highest potential compared to source, drain and gate terminals to prevent a phenomenon known as latch-up.

Schottky diode 565 is connected between the source and drain terminals of PMOS transistor 560. Schottky diode 575 is connected between the source and drain terminals of PMOS transistor 570. Schottky diode 565 enables the voltage on path 112 (Vmax) to quickly charge to Vbat during (and immediately after) power-ON of charge pump 100. When the circuit/component (e.g., DC-DC converter 210 and/or power amplifier 230) which uses charge pump 100 is not operational (i.e., powered ON), Vpos has a voltage of 0 volts, and selector 110 is designed to provide Vbat on path 112 (Vmax). Comparator 530 is designed to generate signal 531 to have a logic zero state during ramping up of Vpos starting from 0 volts. As a result, Vmax 112 receives Vbat before and during ramping up of Vpos. Schottky diode 565 causes Vmax 112 to quickly receive Vbat even if switch 560 were to be slow to switch ON.

Schottky diodes 565 and 575 also prevent conduction of parasitic bulk diodes in switches 560 and 570. As is well known in the relevant arts, MOS transistors contain parasitic bipolar transistors due to the manner in which MOS transistors are constructed. For example, a PMOS transistor, such as transistors 560 and 570, may contain a parasitic bipolar PNP transistor. The bipolar transistor is formed by the p-type source terminal, the n well and the p-type substrate. Transistor 566 represents such a parasitic bipolar transistor. Switch 570 would contain a similar parasitic bipolar transistor, but is not shown in FIG. 570 in the interest of clarity.

A parasitic bipolar transistor can be switched ON if the corresponding source-to-n-well bulk diode is turned ON. Such turning ON of a bulk diode can occur if the corresponding P-type source-to-n-well potential is biased by a voltage greater than about 700 millivolts. Such turning-ON of a bulk diode is undesirable since this would cause the corresponding bipolar transistor to turn ON, and cause the substrate (p-type in the case of switches 560 and 570) potential to rise.

As noted above, the bulk terminals (which are connected to the n-well) of transistors 560 and 570 are each connected to the drain terminal. Therefore, the voltage drop from the source terminal to the bulk terminal of each of transistors 560 and 570 needs to be prevented from being forward-biased by about 700 millivolts. The respective Schottky diodes 565 and 575 prevent such forward-biasing by clamping the source-to-n-well voltage to (approximately) 300 millivolts. As a result, the parasitic bulk diodes, and thus the parasitic bipolar transistors, are prevented from turning ON accidentally.

While the description above has been provided with respect to positive magnitudes for Vpos and Vbat, it is to be understood that a charge pump provided according to aspects of the present disclosure can also be used, with appropriate modifications as would be obvious to one skilled in the relevant arts, in instances when both Vpos and Vbat are negative voltages.

Another aspect of the present disclosure prevents shorting of power sources Vbat and Vpos, as described next.

5. Preventing Shorting of Power Sources

According to an aspect of the present disclosure, a circuit 510 (of FIG. 5) is designed to receive Vmax (112) and generate a derived power source Vmaxdrvsup, which is applied to the power terminals 559 of level shifter 550. Circuit 510 is shown containing Schottky diode 511, resistor 512 and capacitor 513. In an alternative embodiment, a peak detector circuit can be used in place of circuit 510.

Shorting of power sources Vbat and Vpos can occur due to slow response of level shifter 550, especially when the magnitudes of Vpos and Vbat are very nearly the same, and when one of the source exhibits ringing (typically in the Mega Hertz range), as shown in FIGS. 6A and 6B. FIGS. 6A-6D illustrate examples of situations when Vbat and Vpos can get shorted. Assume that Vmax (112) (rather than Vmaxdrvsup) powers level shifter 550, i.e., circuit 510 is not present. Assume further, for example, that Vbat and Vpos are each nearly equal to 3.6 volts, and switch 570 is ON (switch 560 being OFF) thereby providing Vpos on path 112. As a result, Vmax (112) has voltage of 3.6V.

Now, if Vbat were to experience ringing (as depicted in FIG. 6A), Vbat takes on magnitudes above and below 3.6V. When Vbat is 4.3V, for example, Schottky diode 565 is forward biased, and causes a low-impedance path (short) to be formed between power sources Vbat and Vpos. In the absence of Schottky diode 565, the bulk diode between source and bulk terminals of transistor 560 would turn ON. The gate terminal of PMOS switch 560 is at logic high (which is 3.6V 'currently'). As a result, PMOS switch 560 will turn ON since Vgs of PMOS transistor 210 switch is (4.3V−3.6V), which is not sufficient to turn OFF PMOS switch 560. Therefore, a low-impedance path is created between Vbat and Vpos by switch 560 being ON also. The corresponding current paths are shown in dotted lines in FIG. 6B.

Another example situation that can lead to a short between Vbat and Vpos is illustrated with respect to FIGS. 6C and 6D. In this example also, it is assumed that Vbat and Vpos are 'initially' nearly equal to 3.6V, and switch 570 is ON (switch 560 being OFF) providing Vpos on path 112. As a result, Vmax (112) has voltage of 3.6V. Now, if Vpos were to experience ringing (as depicted in FIG. 6C), Vpos takes on magnitudes above and below 3.6V. When Vpos is 2.8V, for example, Vmax drops to 2.8V. Schottky diode 565, as well as the bulk diode between source and bulk terminals of switch 560, are forward biased, and cause a low-impedance path to be formed between power sources Vbat and Vpos. The gate terminal of PMOS switch 560 is at logic high (which is 2.8V 'currently'). As a result, PMOS switch 560 will turn ON since Vgs of PMOS transistor 210 switch is (3.6V−2.8V), which is not sufficient to turn OFF PMOS switch 560. Therefore, a low-impedance path is created between Vbat and Vpos by switch 560 being ON also. The corresponding current paths are shown in dotted lines in FIG. 6D. It may be appreciated that the shorting as noted above can occur due to slow response of level shifter 550 in switching OFF the correct switch (and turning on the other switch).

It is noted here that in the situation when switch 560 is normally ON (and 570 is OFF), then a positive in Vpos or a drop in Vbat can cause shorting of Vbat and Vpos in a manner similar to that described above.

To prevent the shorting of Vbat and Vpos, level shifter 550 is powered by Vmaxdrvsup, which is derived from Vmax by circuit 510, which is shown containing Schottky diode 511, resistor 512, and capacitor 513. The anode (positive terminal) and cathode (negative terminal) of Schottky diode 511 are respectively connected to node 112 (Vmax) and a first terminal of capacitor 513. Resistor 512 is connected in parallel with Schottky diode 511. Capacitor 513 is connected between power supply terminal 599 (Vmaxdrvsup) of level shifter 550 and a ground terminal.

The combination of resistor 512 (20 kilo ohm in an embodiment) and capacitor 513 (1 picofarad in an embodiment) rejects high frequency ripple and enables vmaxdrvsup to charge up to the steady state DC voltage of Vmax when there is no ringing in either Vbat or Vpos.

Schottky diode 511 enables Vmaxdrvsup to track Vmax when the voltage at Vbat rises (due to ringing of Vbat) when switch 570 is normally (desired to be) ON and with switch 560 being OFF), or when the voltage at Vpos rises (due to ringing of Vpos) when switch 560 is normally (desired to be) ON with switch 570 being OFF. However, when either the voltage at Vpos falls (due to ringing of Vpos) when switch 570 is normally (desired to be) ON and with switch 560 being OFF), or when the voltage at Vbat falls (due to ringing of Vbat) when switch 560 is normally (desired to be) ON with switch 570 being OFF, Schottky diode 511 prevents Vmaxdrvsup from tracking Vmax when the fall is greater than (−300) millivolts. Due to such effect on Vmaxdrvsup due to Schottky diode 511, shorting of Vbat and Vpos is prevented.

To illustrate, assuming switch 560 is OFF, and switch 570 is ON, and Vbat rises to 4.8V as in the situation illustrated with respect to FIGS. 6A and 6B, Vmax would attempt to increase 4.8V. However, Vmaxdrvsup would also to rise proportionately with Vmax, thereby increasing the voltage at the gate terminal of switch 560, thus maintaining switch 560 OFF (and preventing a short between Vbat and Vpos). On the other hand, when switch 560 is OFF, switch 570 is ON and Vpos falls to 2.4V as in the situation illustrated with respect to FIGS. 6C and 6D, Vmaxdrvsup does not fall with Vmax (due to Schottky diode 511), but instead remains at the same voltage as before, thereby maintaining switch 560 to be in the OFF state (and preventing a short between Vbat and Vpos).

The implementation of an example embodiment of scaler 120 is described next.

6. Scaler

Figure 7:
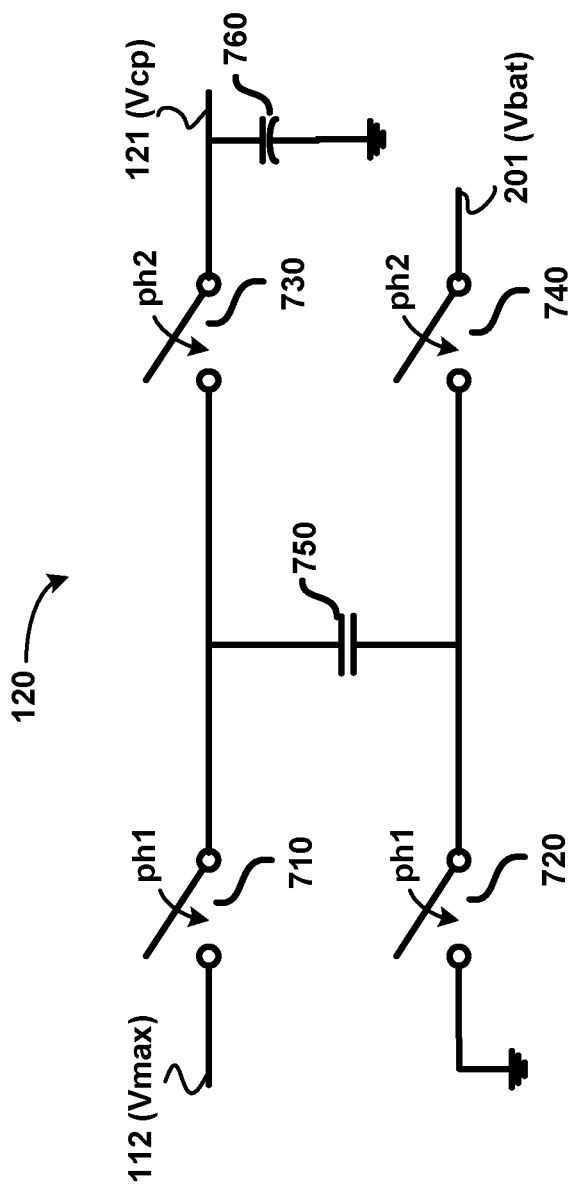
FIG. 7 is a diagram illustrating the implementation details of scaler of a charge pump, in an embodiment of the present disclosure.

FIG. 7 is a diagram illustrating the implementation details of scaler 120, in an embodiment of the present disclosure. Scaler 120 is shown containing switches 710, 720, 730 and 740 and capacitor 760. The switches (which may be implemented as MOS switches, for example) are controlled to be ON or OFF by corresponding control signals ph1 and ph2 as indicated in FIG. 7. Control signals ph1 and ph2 are generated by a clock generator circuit (not shown) in charge pump 100. The clock generator circuit can be implemented in a known way.

In a first phase ph1, switches 710 and 720 are closed, while switches 730 and 740 are open, and capacitor 750 charges to voltage Vmax (112) by the end of the first phase. In a second phase ph2, switches 710 and 720 are open, while switches 730 and 740 are closed. Thus, in phase 2, the bottom plate of capacitor 750 is connected to Vbat, thereby pushing the top plate (which is connected to 770 (Vcp) in phase ph2 to (Vbat+Vmax), which is the desired output, as noted above. Phases ph1 and ph2 alternately repeat. In an embodiment, the switches are operated to be open/closed at a frequency of 1.5 Mega Hertz. Voltage 770 (Vcp) may be applied to terminals 351 and 371 of power amplifier 230 (FIG. 3), and terminals 411, 451 and 461 of DC-DC converter 210 (FIG. 4).

Figure 8A:
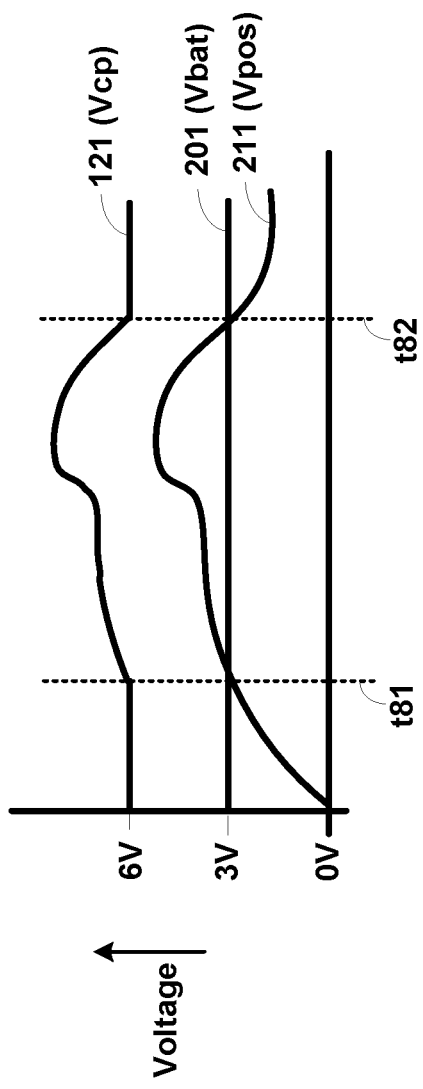
FIG. 8A is a diagram illustrating the output generated by a charge pump according to one example, in an embodiment of the present disclosure.

FIG. 8A is an example diagram illustrating the corresponding scaled voltage Vcp (121) generated by scaler 120 when Vpos varies in analog fashion, and Vbat is a constant voltage of 3V. Vpos is less than Vbat until time instant t81 and after time instant t82, and selector 110 generates select signal 531 and control signal 551 to cause Vmax (112) to be Vbat, which is scaled by scaler 120 by addition of Vbat to generate Vcp equal to 6V. Between time instants t81 and t82, Vpos is greater than Vbat, and selector 110 generates select signal 531 and control signal 552 to cause Vmax (112) to be Vpos, which is scaled by scaler 120 by addition of Vbat to generate Vcp which varies as shown.

Figure 8B:
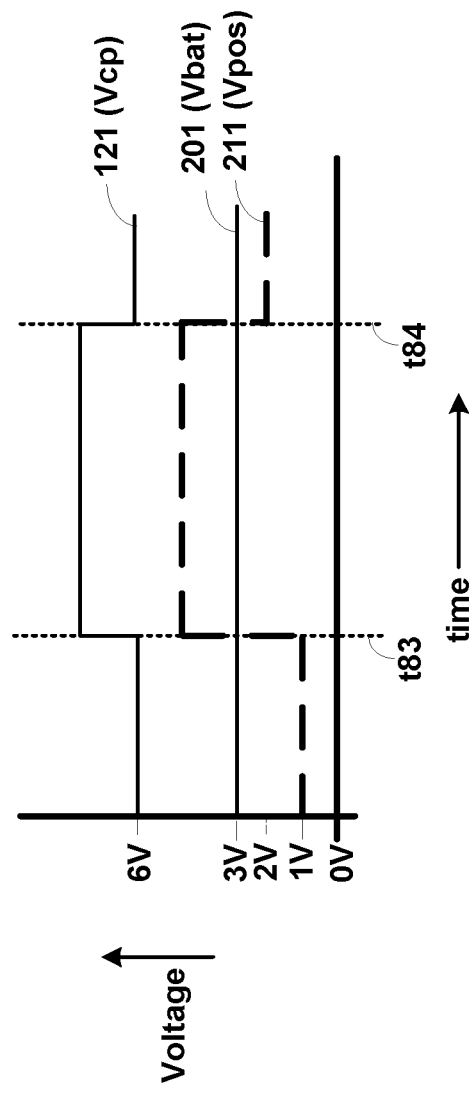
FIG. 8B is a diagram illustrating the output generated by a charge pump according to another example, in an embodiment of the present disclosure.

FIG. 8B is an example diagram illustrating the corresponding scaled voltage Vcp (121) generated by scaler 120 when Vpos varies in discrete fashion, and Vbat is a constant voltage of 3V. Vpos (shown in dotted lines) is less than Vbat until time instant t83 (1 volt) and after time instant t84 (2 volts), and selector 110 generates select signal 531 and control signal 552 to cause Vmax (112) to be Vbat, which is scaled by scaler 120 by addition of Vbat to generate Vcp equal to 6V. Between time instants t81 and t82, Vpos is greater than Vbat, and selector 110 generates select signal 531 and control signal 552 to cause Vmax (112) to be Vpos, which is scaled by scaler 120 by addition of Vbat to generate Vcp as shown.

The specific details of scaler 120 are provided merely as an example. Scaler 120 can be implemented differently to achieve scaling of Vmax 112 by other factors (e.g., to achieve voltage doubling, voltage tripling etc.), as would be apparent to one skilled in the relevant arts upon reading the disclosure provided herein. The combination of two or more of charge pump 100, DC-DC converter 210 and power amplifier 230 may be realized in integrated circuit (IC) form.

7. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 2, 3, 4, 5 and 7, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

It should be further appreciated that the specific type of transistors (NMOS, etc.) noted above are merely by way of illustration. However, alternative embodiments using different configurations and transistors (e.g., bipolar transistors) will be apparent to one skilled in the relevant arts by reading the disclosure provided herein. For example, the NMOS transistors may be replaced with PMOS (P-type MOS) transistors (or a combination of PMOS and NMOS transistors), while also interchanging the connections to power and ground terminals.

Accordingly, in the instant application, power and ground terminals are referred to as constant reference potentials, the source and drain terminals of transistors (though which a current path is provided when turned on and an open path is provided when turned off) are termed as "current terminals", and the gate terminal is termed as a "control terminal". Furthermore, though the terminals are shown with direct connections to various other terminals, it should be appreciated that additional components (as suited for the specific environment) may also be present in the path, and accordingly the connections may be viewed as being electrically coupled to the same connected terminals.

While various embodiments of the present disclosure have been described above, it should be understood that they have been presented by way of example only, and not limitation.

What is claimed is:

1. A charge pump comprising:
   a scaler circuit to scale an intermediate voltage by a scaling factor to generate a scaled voltage; and
   a selector circuit to provide said intermediate voltage from a plurality of voltages, said selector circuit comprising:

a comparator to generate a select signal indicating which one of said plurality of voltages has a highest magnitude;

a plurality of switches, each switch to receive a respective voltage of said plurality of voltages and pass the corresponding voltage as said intermediate voltage if said select signal indicates that the voltage received by the corresponding switch has the highest magnitude, wherein one switch of said plurality of switches passes the corresponding received voltage as said intermediate voltage, while the remaining ones of said plurality of switches block the corresponding received voltages.

2. The charge pump of claim 1, wherein each of said plurality of switches has three terminals, said three terminals containing a pair of terminals and a third terminal, wherein a conductive path is provided between said pair of terminals if a drive voltage at the third terminal is in one state and a non-conductive path is provided between said pair of terminals if the drive voltage is in another state, wherein each voltage of said plurality of voltages is provided on a respective one of a first terminal of the pair of terminals of the respective switches, and wherein all the second terminals of the pair of terminals are coupled to a common path on which said selector circuit provides said intermediate voltage, wherein the select signal is used to generate a plurality of control signals, wherein each control signal is provided as the corresponding drive voltage of the respective switch, wherein only one of the plurality of control signals is in said one state and the remaining ones of the control signals are in said another state, wherein said intermediate voltage comprises the voltage provided on the second terminal of a switch with drive voltage in said one state.

3. The charge pump of claim 2, further comprising a level shifter for generating said plurality of control signals from said select signal, wherein said level shifter is powered for operation by a derived voltage, wherein said derived voltage is derived from said intermediate voltage, wherein said comparator is powered for operation by a first voltage of said plurality of voltages.

4. The charge pump of claim 3, wherein operation of said level shifter from said derived voltage is designed to prevent a low-impedance path from being formed between a pair of voltages in said plurality of voltages.

5. The charge pump of claim 3, wherein a first switch receiving said first voltage of said plurality of voltages contains a diode coupled between the pair of terminals of said first switch.

6. The charge pump of claim 4, wherein said plurality of voltages comprise said first voltage and a second voltage only, wherein said plurality of switches comprise a first switch and a second switch, wherein each of first switch and said second switch is a metal-oxide semiconductor (MOS) switch, wherein one of said first voltage and said second voltage is a varying voltage.

7. The charge pump of claim 6, wherein each of said first voltage and said second voltage is a unipolar voltage, wherein said MOS switch is a P-type MOS (PMOS) switch, wherein said plurality of control signals comprise a first control signal and a second control signal, wherein a first current terminal of each of said first switch and said second switch is coupled to receive said first voltage and said second voltage respectively, wherein a second current terminal of each of said first switch and said second switch is coupled to said common path, wherein a control terminal of said first switch is coupled to receive said first control signal, and a control terminal of said second switch is coupled to receive said second control signal, wherein a bulk terminal of each of said first switch and said second switch is coupled to the second current terminal of the respective switch, wherein a first Schottky diode is coupled between the first current terminal of said first switch and the bulk terminal of said first switch, and wherein a second Schottky diode is coupled between the first current terminal of said second switch and the bulk terminal of said second switch.

8. The charge pump of claim 7, further comprising:

a third Schottky diode, a resistor and a capacitor, wherein the anode of said third Schottky diode is coupled to receive said intermediate voltage, the cathode of said third Schottky diode is coupled to a power supply terminal of said level shifter, wherein said derived voltage is provided on said power supply terminal of said level shifter, wherein said resistor is coupled in parallel with said third Schottky diode, and wherein said capacitor is coupled between said power supply terminal and a first constant reference potential.

9. The charge pump of claim 8, wherein said scaler circuit comprises:

a third switch, a fourth switch, a fifth switch, a sixth switch, a second capacitor and a third capacitor, wherein a first terminal of said third switch is coupled to receive said intermediate voltage, wherein a second terminal of said third switch is coupled to a first terminal of said second capacitor, wherein a first terminal of said fourth switch is coupled to said first constant reference potential, wherein a second terminal of said third switch is coupled to a second terminal of said second capacitor, wherein a first terminal of said fifth switch is coupled to said first terminal of said second capacitor, wherein a second terminal of said fifth switch is coupled to a first terminal of said third capacitor, wherein a first terminal of said sixth switch is coupled to receive said first voltage, wherein a second terminal of said sixth switch is coupled to said second terminal of said second capacitor, and wherein a second terminal of said third capacitor is coupled to said first constant reference potential, wherein each of said third switch and fourth switch is operable to be closed in a first phase of operation of said scaler circuit, wherein each of said fifth switch and sixth switch is operable to be open in said first phase, wherein each of said third switch and fourth switch is operable to be open in a second phase of operation of said scaler circuit, wherein each of said fifth switch and sixth switch is operable to be closed in said first phase, wherein said second phase immediately follows said first phase, and designed to repeat alternately, wherein said scaled voltage is provided on said first terminal of said third capacitor.

10. An article of manufacture comprising:

a circuit block operative based on a plurality of voltages, said circuit block comprising a first plurality of switches, wherein each switch of said first plurality of switches requires a scaled voltage greater than any of said plurality of voltages for switching ON said switch; and a charge pump to generate said scaled voltage, wherein said charge pump comprises:
- a scaler circuit to scale an intermediate voltage by a scaling factor to generate said scaled voltage; and
- a selector circuit to provide said intermediate voltage from said plurality of voltages, said selector circuit comprising:
  - a comparator to generate a select signal indicating which one of said plurality of voltages has a highest magnitude;
  - a second plurality of switches, each switch in said second plurality of switches to receive a respective voltage of said plurality of voltages and pass the corresponding voltage as said intermediate voltage if said select signal indicates that the voltage received by the corresponding switch has the highest magnitude, wherein one switch of said plurality of switches passes the corresponding received voltage as said intermediate voltage, while the remaining ones of said plurality of switches block the corresponding received voltages.

11. The article of manufacture of claim 10, wherein said article of manufacture is a class-L amplifier comprising a DC-DC converter and a power amplifier, wherein said circuit block is comprised in one or both of said DC-DC converter and said power amplifier,
wherein each switch of said first plurality of switches is an N-type Metal Oxide Semiconductor (MOS) switch.

12. The article of manufacture of claim 10, wherein each of said second plurality of switches has three terminals containing a pair of terminals and a third terminal, wherein a conductive path is provided between said pair of terminals if a drive voltage at the third terminal is in one state and a non-conductive path is provided between said pair of terminals if the drive voltage is in another state,
wherein each voltage of said plurality of voltages is provided on a respective one of a first terminal of the pair of terminals of the respective switches of said second plurality of switches, and wherein all the second terminals of the pair of terminals are coupled to a common path,
wherein said select signal is used to generate a plurality of control signals, wherein each control signal is provided as the corresponding drive voltage of said respective switch, wherein only one of the plurality of control signals is in said one state and the remaining ones of the control signals are in said another state,
wherein said intermediate voltage comprises the voltage provided on the first terminal of a switch with drive voltage in the one state.

13. The article of manufacture of claim 12, further comprising a level shifter for generating said plurality of control signals from said select signal, wherein said level shifter is powered for operation by a derived voltage, wherein said derived voltage is derived from said intermediate voltage, wherein said comparator is powered for operation by a first voltage of said plurality of voltages.

14. The article of manufacture of claim 13, wherein operation of said level shifter from said derived voltage is designed to prevent a low-impedance path from being formed between a pair of voltages in said plurality of voltages.

15. The article of manufacture of claim 13, wherein a first switch receiving said first voltage of said plurality of voltages contains a diode coupled between the pair of terminals of said first switch, said first switch being contained in said second plurality of switches.

16. The article of manufacture of claim 14, wherein said plurality of voltages comprise said first voltage and a second voltage only, wherein said second plurality of switches comprise a first switch and a second switch, wherein each of first switch and said second switch is a metal-oxide semiconductor (MOS) switch,
wherein one of said first voltage and said second voltage is a varying voltage, said varying voltage being used to power said power amplifier.

17. The article of manufacture of claim 16, wherein each of said first voltage and said second voltage is a unipolar voltage, wherein said MOS switch is a P-type MOS (PMOS) switch, wherein said plurality of control signals comprise a first control signal and a second control signal,
wherein a first current terminal of each of said first switch and said second switch is coupled to receive said first voltage and said second voltage respectively,
wherein a second current terminal of each of said first switch and said second switch is coupled to said intermediate voltage,
wherein a control terminal of said first switch is coupled to receive said first control signal, and a control terminals of said seconds switch is coupled to receive said second control signal,
wherein a bulk terminal of each of said first switch and said second switch is coupled to the second current terminal of the respective switch,
wherein a first Schottky diode is coupled between the first current terminal of said first switch and the bulk terminal of said first switch, and
wherein a second Schottky diode is coupled between the first current terminal of said second switch and the bulk terminal of said second switch.

18. The article of manufacture of claim 17, wherein said selector circuit further comprises:
a third Schottky diode, a resistor and a capacitor,
wherein the anode of said third Schottky diode is coupled to receive said intermediate voltage, the cathode of said third Schottky diode is coupled to a power supply terminal of said level shifter, said power supply terminal being at a voltage equal to said derived voltage,
wherein said resistor is coupled in parallel with said third Schottky diode, and
wherein said capacitor is coupled between said power supply terminal and a first constant reference potential.

19. The article of manufacture of claim 18, wherein said scaler circuit comprises:
a third switch, a fourth switch, a fifth switch, a sixth switch, a second capacitor and a third capacitor,
wherein a first terminal of said third switch is coupled to receive said intermediate voltage, wherein a second terminal of said third switch is coupled to a first terminal of said second capacitor,
wherein a first terminal of said fourth switch is coupled to said first constant reference potential, wherein a second terminal of said third switch is coupled to a second terminal of said second capacitor,
wherein a first terminal of said fifth switch is coupled to said first terminal of said second capacitor, wherein a second terminal of said fifth switch is coupled to a first terminal of said third capacitor, wherein a first terminal of said sixth switch is coupled to said receive said first voltage, wherein a second terminal of said sixth switch is coupled to said second terminal of said second capacitor, and wherein a second terminal of said third capacitor is coupled to said first constant reference potential, wherein each of said third switch and fourth switch is operable to be closed in a first phase of operation of said scaler circuit, wherein each of said fifth switch and sixth switch is operable to be open in said first phase, wherein each of said third switch and fourth switch is operable to be open in a second phase of operation of said scaler circuit, wherein each of said fifth switch and sixth switch is operable to be closed in said first phase, wherein said second phase immediately follows said first phase, and designed to repeat alternately, wherein said scaled voltage is provided on said first terminal of said third capacitor.

* * * * *